United States Patent [19]

Komatsu

[11] 4,159,442
[45] Jun. 26, 1979

[54] CIRCUIT FOR LIGHTING LIKE CANDLELIGHT

[76] Inventor: Kojo Komatsu, 1-11-24, Matsubara, Setagaya-ku, Tokyo 156, Japan

[21] Appl. No.: 852,500

[22] Filed: Nov. 17, 1977

[30] Foreign Application Priority Data

Nov. 24, 1976 [JP] Japan .................. 51-142387
Jan. 12, 1977 [JP] Japan .................. 52-2227[U]

[51] Int. Cl.² .................. H05B 37/02; H05B 39/08
[52] U.S. Cl. .................. 315/156; 315/158; 315/199; 315/209 R; 315/226; 362/810
[58] Field of Search .................. 315/156, 158, 194, 199, 315/200 A, 209 R, 226; 250/578; 362/810

[56] References Cited

U.S. PATENT DOCUMENTS

| 3,500,126 | 3/1970 | Ford .................. 315/209 R |
| 3,710,182 | 1/1973 | Van Reenen .................. 315/199 |
| 3,719,857 | 3/1973 | Sharp .................. 315/156 |
| 4,064,414 | 12/1977 | Bergeson et al. .................. 315/199 X |

*Primary Examiner*—Eugene R. LaRoche
*Attorney, Agent, or Firm*—Oblon, Fisher, Spivak, McClelland & Maier

[57] ABSTRACT

This invention relates to a circuit for lighting like a candlelight. The circuit has a lighting means having at least one incandescent lamp, and a control means which has a plurality of oscillators which can be oscillated with substantial equal frequencies. The control means controls an electric current flowing through the lighting means by a composite output of the oscillators. The each oscillator may be a relaxation oscillator which has a neon tube, and the control means may have a photo dependent resistor adapted to receive a composite light of lights emitted by the neon tubes, whereby the resistance of the photo dependent resistor being varied so as to control the electric current flowing through the lighting means.

9 Claims, 1 Drawing Figure

U.S. Patent    Jun. 26, 1979    4,159,442
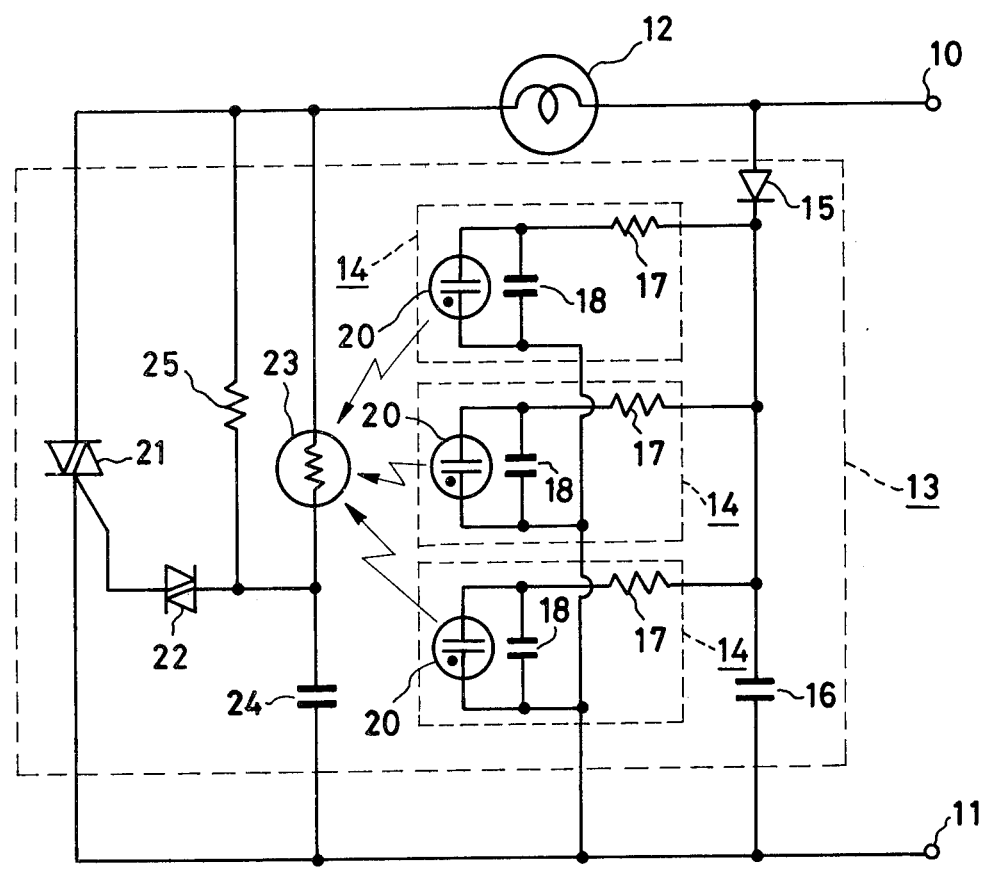

CIRCUIT FOR LIGHTING LIKE CANDLELIGHT

BACKGROUND OF THE INVENTION

This invention relates to a circuit for lighting like a candlelight, and more particularly to a circuit which can continuously and irregularly vary luminous intensity of a light emitted by the circuit.

An illuminating device which uses a candle or candles has a little utility because of possibility of breaking out of a fire and a limited lighting time of a candle. Many of illuminating devices of such kind have been changed to devices having electric lamps. But, such illuminating devices are irksome, because an electric lamp cannot easily vary luminous intensity of a light emitted by the lamp.

Therefore, electric lighting devices which can change luminous intensities have been developed using mechanical or electrical methods. In the mechanical methods, the devices become complicated and expensive structures. In the electrical methods, it is not possible to obtain a device which can continuously and irregularly vary luminous intensity of a light. A device which has a plurality of electric lamps in an envelope and can change number of lighting lamps is known. A device shown in U.S. Pat. No. 3,710,182 has an incandescent lamp and a thyristor being connected in series across an alternate current source and an oscillator supplying gate pulses to the thyristor to energize the lamp. The device can vary luminous intensity of a light only constantly or periodically.

SUMMARY OF THE INVENTION

Accordingly, it is an object of this invention to provide a circuit for lighting like a candlelight which can vary luminous intensity of a light continuously and irregularly.

Another object of this invention is to provide a circuit for lighting like a candlelight which is simple and inexpensive.

The foregoing objectives are achieved according to this invention through the provision of a circuit for lighting like a candlelight comprising a lighting means having at least one lamp, and a control means having a plurality of oscillators which can be oscillated with substantial equal frequencies and controlling an electric current flowing through the lighting means. The each oscillator emits a light as an output thereof. The control means controls the electric current by all of the lights emitted from the oscillators. The each oscillator may be a relaxation oscillator having a neon tube, the control means may have a photo dependent resistor which is adapted to receive a composite light of lights emitted by neon tubes, whereby the resistance of the photo dependent resistor is varied so as to control the electric current flowing through the lighting means.

BRIEF DESCRIPTION OF THE DRAWING

Various other objects, features, and attendant advantages of the present invention will be more fully appreciated as the same becomes better understood from the following detailed description when considered in connection with the accompanying drawing wherein the sole FIGURE is a diagram of a circuit of one embodiment of this invention.

DESCRIPTION OF THE PREFERRED EMBODIMENT

In an embodiment of this invention shown in FIGURE, a pair of terminals 10 and 11 are provided for connection to a conventional alternate electric source. A lighting means or an incandescent lamp 12 is connected between the terminals 10 and 11.

13 generally designates a control means which has three relaxation oscillators 14. The each oscillator is connected between the terminals 10 and 11 and adapted to supply a direct current thereto by a diode 15 and a condenser 16. The each oscillator 14 is composed of a resistor 17, a condenser 18 and a source of light or a neon tube 20 which repeats lighting off and on. The oscillators 14 are made so as to have substantial equal frequencies. But, very small differences are irregularly created because the frequency of the each oscillator 14 is independently changed a small value owing to various conditions, for example temperature of air surrounding the oscillator and a small variation in the voltage of the electric source. Therefore, a composite light of lights emitted by the neon tubes 20 irregularly makes a beat phenomenon which means that the luminous intensity of the composite light irregularly varies to a large value at a time and to a small value at the other time.

The control means 13 has a bidirectional triode thyristor 21 which is connected between the lamp 12 and the terminal 11. A bidirectional diode thyristor 22 is connected to the gate electrode of the thyristor 21 for switching of the thyristor 21.

The control means 13 also includes a photo dependent resistor 23 which is adapted to receive the composite light of lights emitted by the neon tubes 20, whereby the resistance thereof is irregularly varied by the luminous intensity of the composite light. A condenser 24 is connected in series with the photo dependent resistor 23. The circuit composed of the photo dependent resistor 23 and the condenser 24 is connected in parallel with the thyristor 21, and the connecting point between the photo dependent resistor 23 and the condenser 24 is connected to the thyristor 22. A resistor 25 is connected in parallel with the photo dependent resistor 23. Therefore, the current flow angle of the thyristor 21 for supplying an alternate current to the lamp 12 is controlled by the varying of the resistance of the photo dependent resistor 23. The photo dependent resistor 23 has a small time lag for varying the resistance thereof, therefore it does not sensitively respond to the lighting off and on of the neon tubes 20, and it responds to an averaged value of the composite light in a short time interval. The resistor 25 makes it possible that the lamp 12 can be lighted with a small luminous intensity even at a time when the resistance of the photo dependent resistor 23 becomes to a large value.

Thus, the luminous intensity of the light emitted by the lamp 12 can be continuously and irregularly varied like a candlelight.

In this invention, various modifications will be made. For example, it is possible that a lighting means can include a plurality of lamps connected in series and/or parallel. A plurality of oscillators which are not relaxation oscillators can be used for control a current flowing through a lighting means by all of lights emitted from the oscillators.

The foregoing is of course considered as illustrative only of the principle of the invention. Obviously, numerous modifications and variations of the present invention are possible in light of the above teachings.

What is claimed is:

1. A circuit for lighting like a candlelight comprising:
   lighting means having at least one lamp, and
   control means having a plurality of oscillators which can be oscillated with substantially equal frequencies for controlling an electric current flowing through said lighting means,
   wherein each said oscillator emits a light as an output thereof, and said control means controls said electric current in response to all of said lights emitted from said oscillators.

2. A circuit as set forth in claim 1, wherein each of said oscillators is a relaxation oscillator having a neon tube, said control means has a photo dependent resistor which is adapted to receive a composite light of lights emitted by said neon tubes, whereby the resistance of said photo dependent resistor is varied so as to control said electric current flowing through said lighting means.

3. A circuit as set forth in claim 2, wherein said circuit is to be connected to an alternating electric source, said control means has a bidirectional triode thyristor connected in series with said lighting means, a resistor connected in parallel with said photo dependent resistor, a condenser connected in series with said photo dependent resistor, a circuit composed of said photo dependent resistor and said condenser being connected in parallel with said bidirectional triode thyristor, and a bidirectional diode thyristor connected between the gate electrode of said bidirectional triode thyristor and the connecting point between said photo dependent resistor and said condenser.

4. A circuit as set forth in claim 1, wherein said lamp is an incandescent lamp.

5. A circuit as set forth in claim 4, wherein said control means has a photo dependent resistor which is adapted to receive a composite light of said lights emitted from said oscillators, whereby the resistance of said photo dependent resistor is varied so as to control said electric current flowing through said lighting means.

6. A circuit as set forth in claim 4, wherein each of said oscillators is a relaxation oscillator having a neon tube for emitting said light.

7. A circuit as set forth in claim 6, wherein said control means has a photo dependent resistor which is adapted to receive a composite light of said lights emitted from said neon tubes, whereby the resistance of said photo dependent resistor is varied so as to control said electric current flowing through said lighting means.

8. A circuit for lighting like a candlelight comprising:
   lighting means having at least one incandescent lamp, and
   a control means having a photo dependent resistor and a plurality of oscillators which can be oscillated with substantially equal frequencies for controlling an electric current flowing through said lighting means,
   wherein each oscillator has a source of light for emitting a light as an output, and said photo dependent resistor is adapted to receive said lights emitted from said sources, whereby the resistance of said photo dependent resistor is varied so as to control an electric current flowing through said lighting means.

9. A circuit as set forth in claim 8, wherein each said oscillator is a relaxation oscillator having a neon tube as said source of light.

* * * * *